(12) United States Patent
Puschner et al.

(10) Patent No.: US 7,100,836 B2
(45) Date of Patent: Sep. 5, 2006

(54) MODULE FOR CONTACTLESS CHIP CARDS OR IDENTIFICATION SYSTEMS

(75) Inventors: Frank Puschner, Kelheim (DE); Andreas Muller-Hipper, Regensburg (DE); Andreas Karl, Tegernheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/001,781

(22) Filed: Dec. 1, 2004

(65) Prior Publication Data

US 2005/0116051 A1 Jun. 2, 2005

(30) Foreign Application Priority Data

Dec. 2, 2003 (DE) ............... 103 56 153

(51) Int. Cl.
*G06K 19/06* (2006.01)
(52) U.S. Cl. .................. 235/492; 235/487
(58) Field of Classification Search ........ 235/492, 235/441, 487, 440, 380; 438/106–107, 125, 438/12; 343/718
See application file for complete search history.

(56) References Cited

U.S. PATENT DOCUMENTS 4,910,394 A * 3/1990 Ohta ............... 235/492
5,198,647 A * 3/1993 Mizuta ............. 235/449
5,999,409 A * 12/1999 Ando et al. .......... 361/737
6,190,942 B1 * 2/2001 Wilm et al. ........... 438/107
6,378,774 B1 * 4/2002 Emori et al. ......... 235/492

FOREIGN PATENT DOCUMENTS

| DE | 196 30 049 A1 | 1/1998 |
| DE | 197 03 990 A1 | 8/1998 |
| DE | 100 30 667 A1 | 1/2002 |
| DE | 10108080 C1 * | 4/2002 |
| WO | WO-96/05614 A1 | 2/1996 |

\* cited by examiner

*Primary Examiner*—Daniel Stcyr
*Assistant Examiner*—Lisa M. Caputo
(74) *Attorney, Agent, or Firm*—Dickstein Shapiro LLP

(57) ABSTRACT

Module for contactless chip cards or identification systems having a first antenna contact strip and a second antenna contact strip, which each have a first surface and a second surface facing away from the first surface, a semiconductor chip with at least two contacts, at least one contact contact-connecting the first surface of the first antenna contact strip and at least one further contact contact-connecting the first surface of the second antenna contact strip, and at least one adhesive film strip, which at least partially covers the first surface of both the first antenna contact strip and the second antenna contact strip, the at least one adhesive film strip being arranged outside a region of the first and second antenna contact strips that is covered by the semiconductor chip.

5 Claims, 1 Drawing Sheet

MODULE FOR CONTACTLESS CHIP CARDS OR IDENTIFICATION SYSTEMS

CROSS-REFERENCE TO RELATED APPLICATION

This application claims priority to German Patent Application Serial No. 10356153.6, filed Dec. 2, 2003, and which is incorporated herein by reference in its entirety.

FIELD OF THE INVENTION

The invention relates to a module for contactless chip cards or identification systems.

BACKGROUND OF THE INVENTION

Such modules for contactless chip cards or identification systems are known per se, for example under designation MCC2 from Infineon Technologies AG. One possible process for producing these modules is also known from patent application WO 96/05614.

It is to be considered an important factor of this known production process that a chip with contact bumps is fixed by an acrylate film located on a leadframe. The contact bumps are pressed through the film and contact-connected to the leadframe by diffusion soldering. The acrylate film is located between the chip and the leadframe.

It has proven disadvantageous in a module produced by this process that the acrylate film required for fixing makes a direct contribution to the total thickness of the module. The thickness of a conventional module of approx. 330 to 400 μm requires considerable outlay for embedding it in a chip card which complies with ISO standards to ensure that a good surface quality of the chip card is achieved.

Hitherto, attempts to realize thinner modules of approx. 200 μm in order to avoid these drawbacks and for use in thinner chip cards have failed on account of the demands imposed with regard to robustness and stability during chip production and in the environment of use.

SUMMARY OF THE INVENTION

It is an object of the present invention to provide a module for contactless chip cards or identification systems which is thinner than the previous modules yet nevertheless has sufficient robustness and stability during chip production and in the environment of use.

According to the invention, this object is achieved by a module for contactless chip cards or identification systems, having
- a first antenna contact strip and a second antenna contact strip, which each have a first surface and a second surface facing away from the first surface,
- a semiconductor chip having at least two contacts, at least one contact contact-connecting the first surface of the first antenna contact strip and at least one further contact contact-connecting the first surface of the second antenna contact strip, and
- at least one adhesive film strip which at least partially covers the first surface of both the first antenna contact strip and the second antenna contact strip,
- wherein the at least one adhesive film strip is arranged outside a region of the first and second antenna contact strips covered by the semiconductor chip.

On account of the fact that the adhesive film strip is no longer located between the semiconductor chip and the antenna contact strips, but rather is merely arranged next to the semiconductor chip on the antenna contact strips, it is possible to reduce the overall thickness of the module, since the adhesive film strip is no longer making any contribution to the total thickness.

A specific design of the antenna contact strips which are, for example, part of a leadframe, with very long chip land surfaces, and the altered connection technology make it possible to dispense with the adhesive film in the region below the semiconductor chip. The continuous adhesive film is replaced by at least one adhesive film strip which consists, for example, of a glass fibre-reinforced epoxy film. This adhesive film strip—although not continuous—holds the module together.

The thickness of the adhesive film strip can be selected as desired within the range of the semiconductor chip thickness without it influencing the total thickness of the module. Given a suitable combination of adhesive film thickness and semiconductor chip thickness, the adhesive film strip offers a protective function for the semiconductor chip.

An advantageous refinement of the module according to the invention provides for the first antenna contact strip and the second antenna contact strip each to comprise an antenna connection zone and a chip land zone, the chip land zones being narrower than the antenna connection zones. This division of the antenna contact strips achieves an advantageous design for the module by virtue of allowing space-saving interlinking and stable joining of the two antenna contact strips. It is particularly advantageous if the chip land zone of the first antenna contact strip is arranged parallel to the chip land zone of the second antenna contact strip. As a result of this arrangement, the semiconductor chip can be connected to the antenna contact strip in a particularly space-saving way. If the chip land zones are very long, the chip land zone of the first antenna contact strip can as a result be connected to the chip land zone of the second antenna contact strip in a very simple way by an adhesive film strip next to the semiconductor chip, and the module thereby acquires sufficient stability.

Therefore, in a further advantageous embodiment, it is also provided that the chip land zones are each longer than the semiconductor chip.

According to a preferred refinement of the module according to the invention, a second film is applied to the second surface of the first antenna contact strip and to the second surface of the second antenna contact strip, the second film bridging the spacing between the first antenna contact strip and the second antenna contact strip.

This second film, which is typically a removable acrylic film, but may also comprise other materials, such as for example paper, is used primarily for the process for producing the module, so that a liquid adhesive applied to the first surface cannot flow through the spacing between the first antenna contact strip and the second antenna contact strip. After the production process, this second film can be removed and therefore no longer forms part of the total thickness of the module. Removal of this second film also allows initially joined modules to be divided up. However, it is also possible to leave the second film on the second surface of the first and second antenna contact strips. It then serves as additional electrical insulation. According to a further advantageous embodiment of the module according to the invention, the adhesive film strip has a modulus of elasticity which is higher than the modulus of elasticity of acrylate film. This higher modulus of elasticity makes it possible to increase the reliability and robustness compared to conventional modules.

BRIEF DESCRIPTION OF THE DRAWINGS

An exemplary embodiment of the invention is explained in detail below with reference to the figures in which.

DETAILED DESCRIPTION OF PREFERRED EMBODIMENTS OF THE INVENTION

Figure 1A:
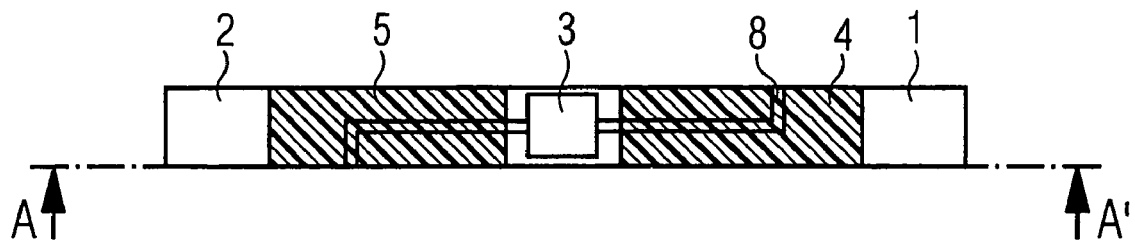
FIG. 1A shows a diagrammatic plan view of the front surface of a module configured in accordance with the invention.

FIG. 1A illustrates a diagrammatic plan view of the front surface of a module configured in accordance with the invention, revealing a first antenna contact strip 1 and a second antenna contact strip 2. The first antenna contact strip 1 and the second antenna contact strip 2 are in each case composed of a wide antenna connection zone and a narrow, finger-shaped chip land zone, the chip land zone being longer than the antenna connection zone.

The first antenna contact strip 1 and the second antenna contact strip 2 are arranged in such a way that the chip land zone of the first antenna contact strip 1 and the chip land zone of the second antenna contact strip 2 are located next to one another and run parallel over their length. A spacing 8 is formed between the first antenna contact strip 1 and the second antenna contact strip 2.

A semiconductor chip 3, which extends from the chip land zone of the first antenna contact strip 1 to the chip land zone of the second antenna contact strip 2 over the spacing 8 between them, is arranged on a first surface of the first antenna contact strip 1 and of the second antenna contact strip 2.

The chip land zones are longer than the semiconductor chip 3. As a result, space remains for two adhesive film strips 4 and 5 (illustrated in hatched form) which are arranged next to the semiconductor chip 3, on the right-hand and left-hand sides, on the first surface of the first and second antenna contact strips 1 and 2. The first adhesive film strip 4 covers a part of the chip land zone of the first antenna contact strip 1 which adjoins the antenna connection zone of the first antenna contact strip 1. Furthermore, the first adhesive film strip 4 covers a part of the antenna connection zone and a part of the chip land zone of the second antenna contact strip 2 which forms an end of the second antenna contact strip 2.

The second adhesive film strip 5 covers, in a dual arrangement, a part of the chip land zone of the second antenna contact strip 2 which adjoins the antenna connection zone of the second antenna contact strip, a part of the antenna connection zone and a part of the chip land zone of the first antenna contact strip 1 which forms the end of the first antenna contact strip 1.

Therefore, both adhesive film strips 4 and 5 extend over the spacing 8 between the first antenna contact strip 1 and the second antenna contact strip 2, and thereby connect the two antenna contact strips 1 and 2. This leads to the required stability of the module.

In each case a part of the antenna connection zones of the first antenna contact strip 1 and of the second antenna contact strip 2 remains uncovered by the adhesive film 4 or 5, respectively, in order thereby to allow subsequent contact connection at these locations. The first antenna contact strip 1 and the second antenna contact strip 2 are, for example, part of a leadframe. The adhesive film 4 and 5 is typically a glass fibre-reinforced epoxy film.

Figure 1B:
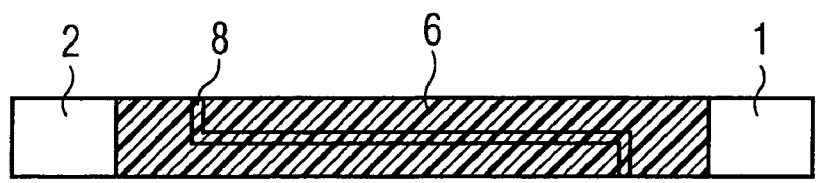
FIG. 1B shows a diagrammatic plan view of the back surface of a module configured in accordance with the invention.

FIG. 1B shows a diagrammatic plan view of the back surface of a module configured in accordance with the invention, illustrating the first antenna contact strip 1 and the second antenna contact strip 2 with the spacing 8 between them. A second film 6 (illustrated in hatched form), which connects the first antenna contact strip 1 to the second antenna contact strip 2 over the spacing 8, has been applied to the second surface of the antenna contact strip 1 and of the second antenna contact strip 2. The second film 6 extends over the entire spacing 8 and prevents a liquid adhesive which has been applied to the first surface in order to fix the semiconductor chip 3 from running through the spacing 8. A removable acrylic film is typically used as film material for the film 6. However, it is also possible to use other materials, such as for example paper. Moreover, the second film 6 extends over at least part of the antenna connection zones on the second surface.

The second film 6 may also be configured in such a way that it serves as a carrier film for a mounting process and the modules can be divided up without the need for a cutting or stamping process after the completion of the module by the second film 6 being removed. However, the second film 6 may also serve as an additional insulation film on the back surface of the completed module. In this case, the second film 6 is not removed.

Figure 2:
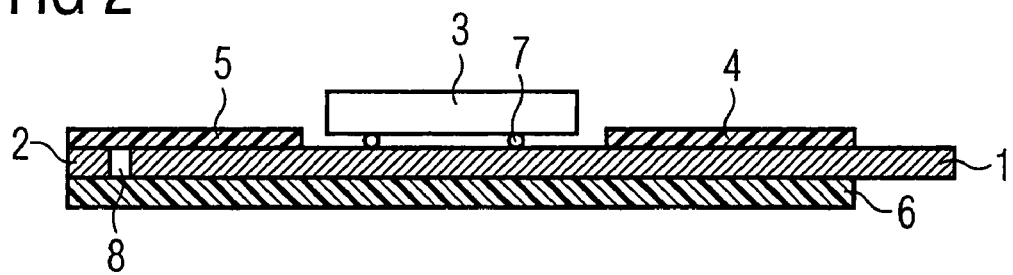
FIG. 2 shows a diagrammatic cross-sectional view through a module configured in accordance with the invention.

FIG. 2 shows a diagrammatic cross-sectional view through a module which has been configured in accordance with the invention, on line A–A' from FIG. 1A, illustrating the structure of the module in terms of its components and their influence on the overall thickness of the module.

A semiconductor chip 3 has been applied to a first surface of a first antenna contact strip 1 and a second antenna contact strip 2. The approx. 60 μm thick antenna contact strip, which is, for example, part of a leadframe, is connected to the approx. 120 μm thick semiconductor chip 3 via contact means 7, typically 10 μm thick NiAu bumps.

A second film 6, which is generally an approx. 30 μm thick, removable acrylic film, has been applied to the back surface of the module, which is diagrammatically depicted in FIG. 2. This second film 6 extends over the spacing 8 between the first antenna contact strip 1 and the second antenna contact strip 2.

Therefore, the overall result is a total thickness of the module of approx. 190 μm if the acrylic film on the back surface is removed or of approx. 220 μm if the acrylic film is not removed.

The adhesive film strips 4 and 5 arranged to the sides of the semiconductor chip 3 on the first surface have no influence on the total thickness of the module provided that they do not exceed the thickness of the semiconductor chip 3 plus the thickness of the contact means 7. In the present case, an adhesive film strip thickness of approx. 130 μm would be possible. However, the adhesive film strip thickness is typically approx. 70 μm.

What is claimed is:

1. A module for contactless chip cards or identification systems, comprising:

a first antenna contact strip and a second antenna contact strip, each having a first surface and a second surface facing away from the first surface;

a semiconductor chip having at least two contacts, at least one contact contact-connecting the first surface of the first antenna contact strip and at least one further contact contact-connecting the first surface of the second antenna contact strip;

a first adhesive film strip which at least partially covers the first surface of both the first antenna contact strip and the second antenna contact strip, wherein the first adhesive film strip is arranged outside a region of the first and second antenna contact strips covered by the semiconductor chip; and a second adhesive film strip applied to the second surface of the first antenna contact strip and to the second surface of the second antenna contact strip, the second adhesive film strip bridging a spacing between the first antenna contact strip and the second antenna contact strip.

2. The module as claimed in claim 1, wherein the first antenna contact strip and the second antenna contact strip each comprise an antenna connection zone and a chip land zone, the chip land zones being narrower than the antenna connection zones.

3. The module as claimed in claim 2, wherein the chip land zone of the first antenna contact strip is arranged parallel to the chip land zone of the second antenna contact strip.

4. The module as claimed in claim 2, wherein the chip land zones are each longer than the semiconductor chip.

5. The module as claimed in claim 1, wherein the adhesive film strip has a modulus of elasticity which is higher than the modulus of elasticity of acrylate film.

* * * * *

UNITED STATES PATENT AND TRADEMARK OFFICE
CERTIFICATE OF CORRECTION

PATENT NO. : 7,100,836 B2  
APPLICATION NO. : 11/001781  
DATED : September 5, 2006  
INVENTOR(S) : Frank Puschner et al.

Page 1 of 1

It is certified that error appears in the above-identified patent and that said Letters Patent is hereby corrected as shown below:

Title page, item [56]  
The following references were omitted under Foreign Patent Documents:

EP 0 388 011 A2 09-19-1990

DE 4403513 A1 08-10-1995

RU 1 503 575 C 08-15-199

Signed and Sealed this

Twenty-sixth Day of December, 2006

JON W. DUDAS  
*Director of the United States Patent and Trademark Office*